US005353405A

United States Patent [19]

Doi et al.

[11] Patent Number: 5,353,405

[45] Date of Patent: Oct. 4, 1994

[54] METHOD OF CONTROLLING IMAGE MEMORY SYSTEM FOR NON-INTERLACE/INTERLACE CONVERSION

[75] Inventors: Kiyotaka Doi; Kanji Masuyama, both of Yokohama; Tsutomu Takagi, Fujisawa; Hitoshi Abe, Isehara; Katsutoshi Tajima, Chigasaki; Tamotsu Hirota, Hadano, all of Japan

[73] Assignees: Hitachi, Ltd., Tokyo; Hitachi Video & Information System, Inc., Yokohama; Hitachi Computer Electronics, Co., Ltd., Hadano, all of Japan

[21] Appl. No.: 887,716

[22] Filed: May 22, 1992

[30] Foreign Application Priority Data

May 27, 1991 [JP] Japan ................................ 3-121104

[51] Int. Cl.[5] ................................ G11C 11/00

[52] U.S. Cl. ................................ 395/164; 395/166

[58] Field of Search ............... 395/162, 164, 165, 166, 395/136, 139, 153, 325, 425; 358/140, 404; 345/200, 187; 348/505, 550, 719, 721

[56] References Cited

U.S. PATENT DOCUMENTS

| | | | |
|---|---|---|---|
| 3,832,487 | 8/1974 | de Niet | 178/7.2 |
| 3,947,826 | 3/1976 | Bockwoldt | 340/173 |
| 4,386,367 | 5/1983 | Peterson | 358/140 |

FOREIGN PATENT DOCUMENTS 1-142987 6/1989 Japan .

*Primary Examiner*—Dale M. Shaw

*Assistant Examiner*—U. Chauhan

*Attorney, Agent, or Firm*—Pennie & Edmonds

[57] ABSTRACT

A method of controlling an image memory system wherein non-interlace image data is written into the odd field and the even field memories, and the contents written into the odd field and even field memories are respectively read out so as to be converted into interlace image data. Each line of the non-interlace image data is alternately written into the odd field and even field memories in units of a plurality of dots. If the plurality of dots include dots for the odd field and dots for the even field, the image data of the plurality of dots are simultaneously written into both the odd field memory and the even field memory. When reading the image data out from the odd field memory, the image data for the even field written into the odd field memory is invalidated. Similarly, when reading the image data out from the even field memory, the image data for the odd field written into the even field memory is invalidated. With this structure, writing/reading operation to the image memory can be performed at high speed without error even when the total number of dots on one line are not divisible by the number of dots to be written into the memories in parallel. Further, it is not necessary to change the output specification of the output device which outputs the image data, such as a computer.

5 Claims, 8 Drawing Sheets

| 4a | 1 | | 645 | 649 | 1 | | 649 |
|---|---|---|---|---|---|---|---|
| 5a | 2 | | 646 | 650 | 2 | | 650 |
| 6a | 3 | | 647 | e1 | 3 | | e1 |
| 7a | 4 | | 648 | e2 | 4 | | e2 |

SERIAL OUT PUT: 1 2 3 4 5 … 645 646 647 648 649 650 e1 e2 1 2 3 4 5 … 649 650 e1 e2

READ CONTROL SIGNAL

VALID DATA — VALID DATA

FIG. 4A

ODD FIELD MEMORY

| 4 a | 1 | 5 | | 645 | 649 | 1 | 5 | | 645 | 649 | 1 | 5 |
|---|---|---|---|---|---|---|---|---|---|---|---|---|
| 5 a | 2 | 6 | | 646 | 650 | 2 | 6 | | 646 | 650 | 2 | 6 |
| 6 a | 3 | 7 | | 647 | e 1 | 3 | 7 | | 647 | e 1 | 3 | 7 |
| 7 a | 4 | 8 | | 648 | e 2 | 4 | 8 | | 648 | e 2 | 4 | 8 |

FIG. 4B

EVEN FIELD MEMORY

| 4 b | o649 | 3 | | 643 | 647 | o649 | 3 | | 643 | 647 | o649 | 3 |
|---|---|---|---|---|---|---|---|---|---|---|---|---|
| 5 b | o650 | 4 | | 644 | 648 | o650 | 4 | | 644 | 648 | o650 | 4 |
| 6 b | 1 | 5 | | 645 | 649 | 1 | 5 | | 645 | 649 | 1 | 5 |
| 7 b | 2 | 6 | | 646 | 650 | 2 | 6 | | 646 | 650 | 2 | 6 |

NUMBER OF DOTS WRITTEN IN PARALLEL
TOTAL NUMBER OF DOTS IN ONE LINE
CLK
START OF GENERATION OF IMAGE DATA
DIVIDER
COMPARATOR
REMAINDER DETECTOR
COUNTER
WE GENERATOR
WE (odd)
WE (even)
12
13
14
15
16
17
8
8
8
8

16
OUTPUT OF COMPARATOR
OUTPUT OF REMAINDER DETECTOR
CLK
SEL
RESET
START OF GENERATION OF IMAGE DATA
71
72
73
74
75
76
77
78
79
80
81
82
D
Q
CK
Q̄
S
R
H
L
RESET
SEL
WE(odd)
WE(even)

| o1 | o6 | o11 | o16 | o21 | e5 | e14 | e15 | e20 | o4 | o9 | o14 | o19 | e3 | e8 | e13 | e18 | o2 | o7 | o12 | o17 |
|---|---|---|---|---|---|---|---|---|---|---|---|---|---|---|---|---|---|---|---|---|
| o2 | o7 | o12 | o17 | e1 | e6 | e11 | e16 | e21 | o5 | o10 | o15 | o20 | e4 | e9 | e14 | e19 | o3 | o8 | o13 | o18 |
| o3 | o8 | o13 | o18 | e2 | e7 | e12 | e17 | o1 | o6 | o11 | o16 | o21 | e5 | e10 | e15 | e20 | o4 | o9 | o14 | o19 |
| o4 | o9 | o14 | o19 | e3 | e8 | e13 | e18 | c2 | o7 | o12 | o17 | e1 | e6 | e11 | e16 | e21 | o5 | o10 | o15 | o20 |
| o5 | o10 | o15 | o20 | e4 | e9 | e14 | e19 | o3 | o8 | o13 | o18 | o2 | o7 | e12 | e17 | o1 | o6 | o11 | o16 | o21 |

METHOD OF CONTROLLING IMAGE MEMORY SYSTEM FOR NON-INTERLACE/INTERLACE CONVERSION

BACKGROUND OF THE INVENTION

The present invention relates to an image memory system provided with image memories for odd field data and even field data, respectively, and particularly to control of the image memories when the total number of dots on one line of image data is not divisible without remainder by the number of dots simultaneously written in the image memories in parallel.

In the conventional image memory system, for example, as described in the Japanese Laid-Open Patent Application (KOKAI) 1-142987, "Image Display Apparatus", an image memory is divided into a plurality of banks so that image data from a host processor are successively written into the respective banks. In reading out the image data from the banks, the image data in the respective banks are data-converted in the look-up table, and the parallel image data outputted from the respective look-up tables is converted by interleaving in a parallel-to-serial converter into serial image data so as to display the image. With this structure, it is possible to provide a high-accuracy display device, which utilizes a high-speed pixel rate which cannot normally be employed owing to the limit of the access speed of the SAM unit within the VRAM (video RAM), by using the VRAM which enhances efficiency of the drawing and displaying of the image data. Also, it is not necessary to provide high-speed look-up tables in the apparatus for the data conversion.

In this conventional technique, processing speed is substantially improved by the use of a plurality of banks as the image memory. However, there remains the problem that it is impossible to process a plurality of pixels from the memory of a computer at the same time, and also, there is no concern given to the method of controlling the remaining data when the total number of dots on one line of the image data is not divisible by the number of dots to be written into the image memories in parallel. Further, there is no disclosure as to the conversion in the scan system between non-interlace and interlace.

SUMMARY OF THE INVENTION

It is therefore an object of the present invention to provide a method of controlling an image memory, by which processing can be performed in the unit of a plurality of pixels (dots), and the writing/reading operation of the image memory can be controlled at high speed without error even if the total number of dots on one line is not divisible without remainder by the number of dots to be written into the image memories in parallel, and an image memory system for realizing the method.

Another object of the present invention is to provide a method of controlling an image memory and an image memory system in which a device which outputs image data, such as a computer, is not subjected to burdens such as changes to the output specification of the computer when non-interlace image data outputted by the computer is converted into interlace image data.

To achieve above-mentioned objects, according to one aspect of the present invention, there is provided a method of controlling an image memory system in which non-interlace image data is written into an odd field memory and an even field memory, and the contents of the odd field memory and the even field memory are separately read out so as to convert the non-interlace image data to interlace image data. This method comprises the steps of writing each line of the non-interlace image data alternately into the odd field memory and the even field memory a plurality of dots by dots, writing image data of the plurality of dots simultaneously into both the odd field memory and the even field memory when the plurality of dots include both dots for the odd field and dots for the even field, invalidating the image data of the dots for the odd field memory written in the even field memory when the image data is read out from the even field memory, and invalidating the image data of the dots for the even field memory written in the odd field memory when the image data is read out from the odd field memory.

According to another aspect of the present invention, there is provided a method of controlling an image memory system in which image data is written into a first image memory and a second image memory, and reading out the contents of the first image memory and the second image memory so as to convert the image data. This method comprises the steps of writing each line of the image data alternately into the first image memory and the second image memory a plurality of dots by dots, writing the image data of the plurality of dots simultaneously into both the first image memory and the second image memory, when the plurality of dots include dots on one line and dots on the adjacent line, invalidating the image data of the dots for the second image memory written in the first image memory when the image data is read out from the first image memory, and invalidating the image data of the dots for the first image memory written in the second image memory when the image data is read out from the second image memory.

According to still another aspect of the present invention, there is provided an image memory system which comprises a first field memory for writing image data on odd lines in parallel a plurality of dots by dots, a second field memory for writing image data on even lines in parallel a plurality of dots by dots, memory control means for controlling writing/reading of the image data with respect to the first and the second field memories, and parallel-to-serial conversion means for converting parallel image data read out from the first and the second field memories by the memory control means, into serial image data. The memory control means have means for writing, when the plurality of dots to be written includes dots for one field memory and dots for another field memory, the image data of the plurality of dots is simultaneously written into both the first and the second field memories.

In operation, the image data is written into the image memory in units of a plurality of dots. In this event, if the total number on one line is not divisible by the number of dots to be written into the image memory in parallel, the image data portion in which the data for the odd field and the data for the even field coexist (i.e., the image data portion in which dots in one line and dots belonging to the adjacent line coexist) is written into both the odd field and the even field memories by controlling the respective enable signals. This allows the output device such as a computer which outputs the image data to send image data in succession irrespective of the total number on one line and the number of dots to be written in parallel. Accordingly, no obligations are imposed on the computer owing to changes of the output specification or the like, thereby easily performing a writing operation into the image memory. When reading out the image data from the respective fields, if the data for another field partly coexists in one field, the portion of the data for the other field is invalidated, thereby normal display can be obtained.

BRIEF DESCRIPTION OF THE DRAWINGS

FIG. 4 is a diagramatic representation showing the state of the storing image in the image memory;

DETAILED DESCRIPTION OF THE PREFERRED EMBODIMENTS

The image memory system for converting non-interlace image data outputted by a computer into interlace image data, will be described with reference to the drawings which show by way of example embodiments of the present invention.

Figure 1:
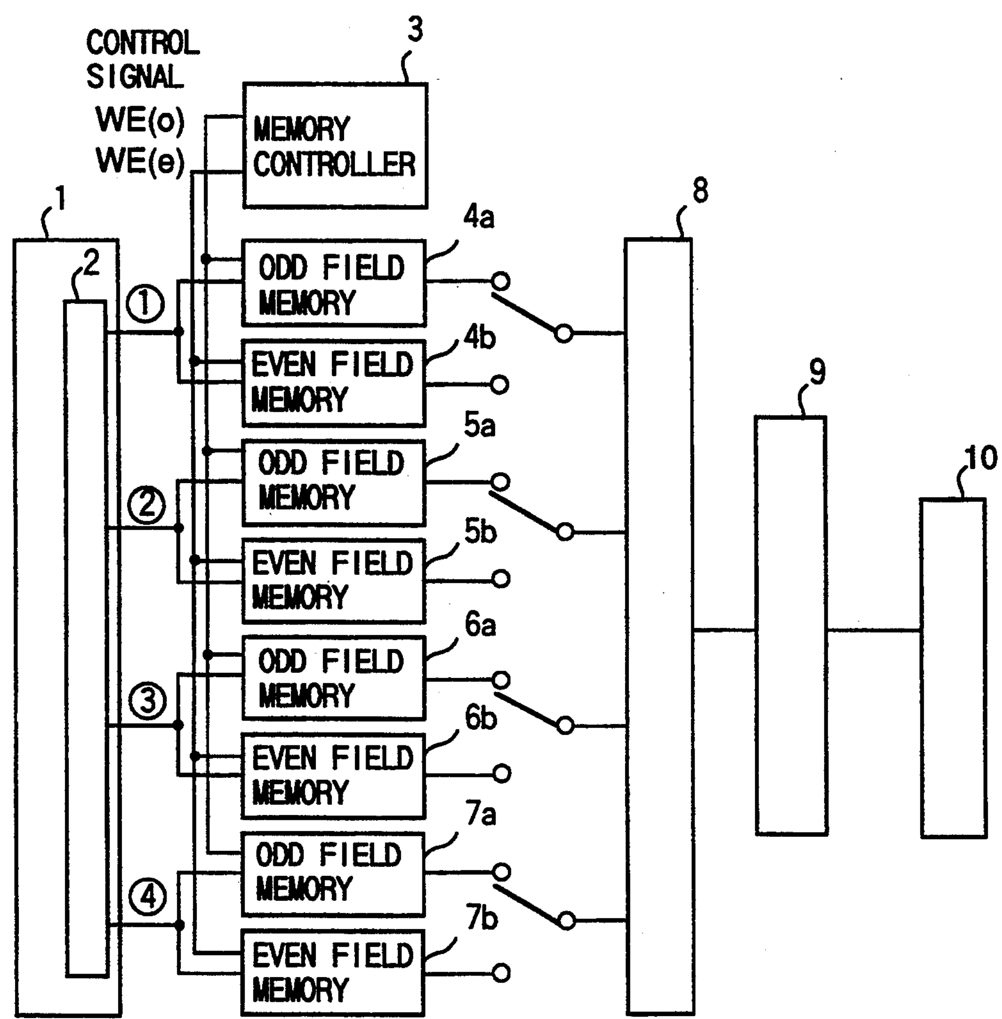
FIG. 1 is a block diagram showing the structure of an image memory system according to an embodiment of the present invention.

FIG. 1 is a block diagram showing the architecture of an image memory system according to an embodiment of the present invention. The apparatus comprises a computer 1, a memory 2 of the computer 1, from which four pixels (dots) of image data are simultaneously outputted, and image memories 4–7 for writing/reading image data outputted from the memory 2. In particular, the image memories 4*a*–7*a* mainly perform writing/reading of the image data for an odd field while 4*b*–7*b* mainly perform writing/reading of the image data for an even field. The image memory system further comprises a memory controller 3 which generates control signals for controlling writing/reading of the image data with respect to the image memories 4–7, a parallel-to-serial converter 8 for converting the parallel image data read out from the image memories 4–7, into the successive image data, a data processing unit 9 and a display device 10. The data processing unit 9 performs processing, i.e., pallet control, D/A conversion, encoding and the like, on the data outputted from the parallel-to-serial converter 8. The display device 10 displays the image signal outputted by the data processing unit 9 which has been converted into an analog signal.

Figure 2:
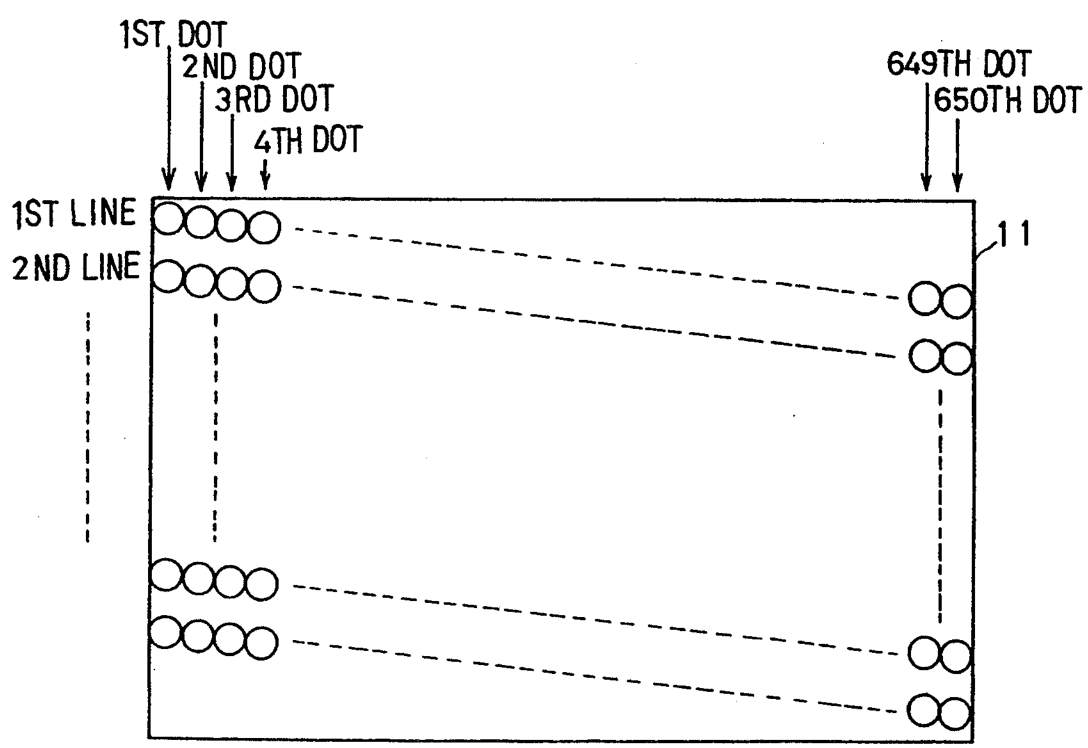
FIG. 2 shows a display screen of a display device.

The operation of the embodiment with the above structure will now be described in connection with the processing for displaying the image data outputted from the memory 2 of the computer 1, on a display screen. In FIG. 2, there is shown the display screen 11 of the display device 10, in which the pixel positioned on the left side of the uppermost line on the screen is designated as the first dot, and the adjacent dot in the right direction is designated as the second dot, and the following dots in the right direction are numbered in order. Finally, the dot furthest to the right on the uppermost line is numbered the 650th dot. The data on the first line is designated as odd field data, the data on the second line is designated as even field data, and the following lines are designated such that the data on odd lines represent odd field data and even lines represent even field data.

Referring to FIG. 1, the first dot among the four dots of the image data simultaneously outputted from the memory 2 of the computer 1, is written into an odd field memory 4*a* on the basis of a write enable signal WE(O) outputted by the memory controller 3. The second dot, the third dot, and the fourth dot are simultaneously written into odd field memories 5*a*, 6*a*, 7*a*, respectively, at the same time with the writing of the first dot. Subsequently, the memory 2 of the computer 1 outputs successive dots of the image data four dots at a time, so that the four dots are written in order into the odd field memories 4*a*–7*a*, respectively. When the 649th dot and the 650th dot on the first line are outputted from the memory 2 of the computer 1, the first dot and second dot on the second line are simultaneously outputted. These four dots, i.e., the 649th and 650th dots on the first line and the first and the second dots on the second line, are written into both the odd field memories 4*a*, 5*a*, 6*a*, and 7*a* and even field memories 4*b*, 5*b*, 6*b*, and 7*b*. Then, a series of dots from the third dot to the 650th dot on the second line are then successively written into the even field memories 4*b*–7*b* four dots at a line. In this manner, the writing of the dots on the first and the second lines are completed. From the third line and after, the writing operation is performed repeatedly in the same way as is described above, resulting in that the writing of the data for one display screen is accomplished.

Figure 3:
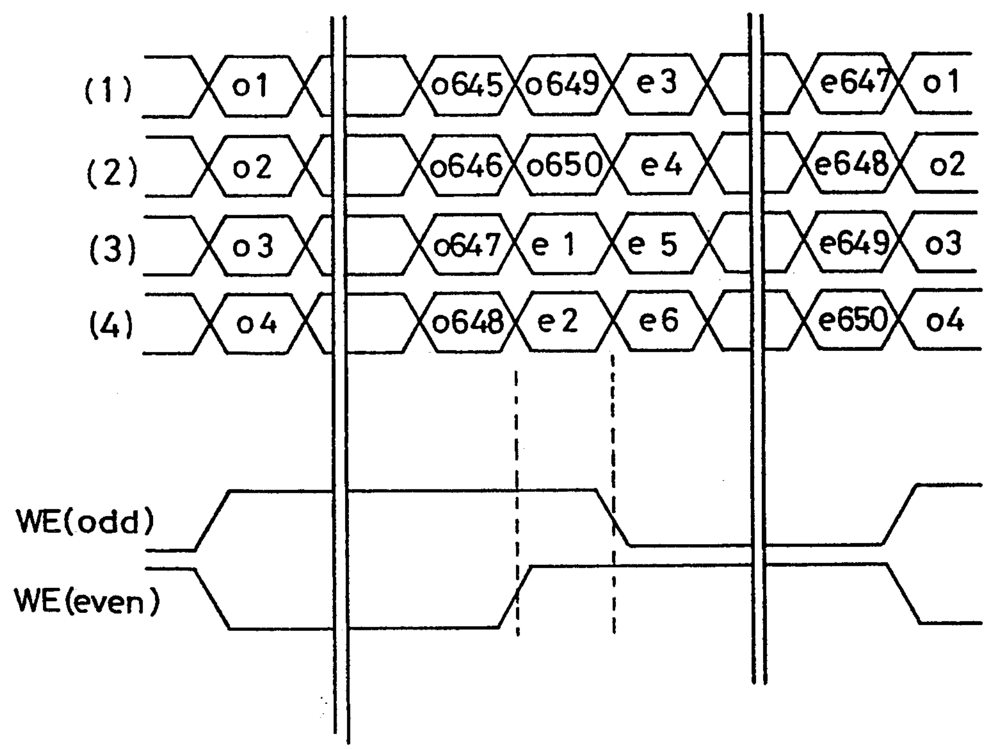
FIG. 3 is a timing chart for explaining the operation of the embodiment of the present invention.

The method of writing the image data outputted from the memory 2 of the computer 1 into the image memories 4–7 will now be described with reference to FIGS. 3 and 4. FIG. 3 shows a method of controlling the image processing apparatus according to the embodiment of the present invention. In FIG. 3, output terminals (1), (2), (3), and (4) of the memory 2 in the computer 1 show that four pixels are simultaneously outputted in terms of the output end of the memory 2 in the computer 1. The dots o1, o2 . . . denote the first dot, the second dot . . . of the image data for the odd field while e1, e2 . . . denote the first dot, second dot . . . of the image data for the even field. WE (odd) and WE (even) represent the control signals or write enable signals for writing the image data into the odd field memory and the even field memory, respectively, and are outputted by the controller 3. The control signals WE (odd) and WE (even), when activated at high-level "1", start writing into the respective field memories.

When the four dots of o649, o650, e1, and e2 of the image data are simultaneously outputted, namely, when the image data for the odd field and the image data for the even field are both outputted, the control signals WE (odd) and WE(even) are both kept at the high-level "1". FIG. 4 shows the status of storing the image data stored in the odd field memories 4*a*–7*a* and the even field memories 4*b*–7*b* according to the method of controlling the image memory system in the present invention. Even if the total number of dots on one line (650 dots in this embodiment) is not divisible without remainder by the number of dots simultaneously written in the field memories in parallel, the image data is written into the corresponding field memory without deficiency or excess, as dots of image data are written into the field memories four dots by four dots. In the embodiment of the present invention, the total number of the dots on one line are set to 650 dots, and the number of the dots written into the image memory in parallel is set to 4, but it should be noted that the present invention is not limited to these numbers.

The reading operation of the image data from the image memory will now be described with reference to FIG. 1. When the writing of all the image data into the image memories has been completed, they are read out from the field memories in the following manner. That is, the image data is initially read out from the odd field memories 4*a*–7*a*, beginning at the dots o1, 02 . . . o649, o650 . . . e1, until the dot e2, and then read out from the even field memories 4*b*–7*b*, beginning at the dots o649, o650, e1, e2 . . . e649 until the dot e650. The following dots of the image data are read out alternately from the odd field memories 4*a*–7*a* and the even field memories 4*b*–7*b* as described above.

Figure 5:
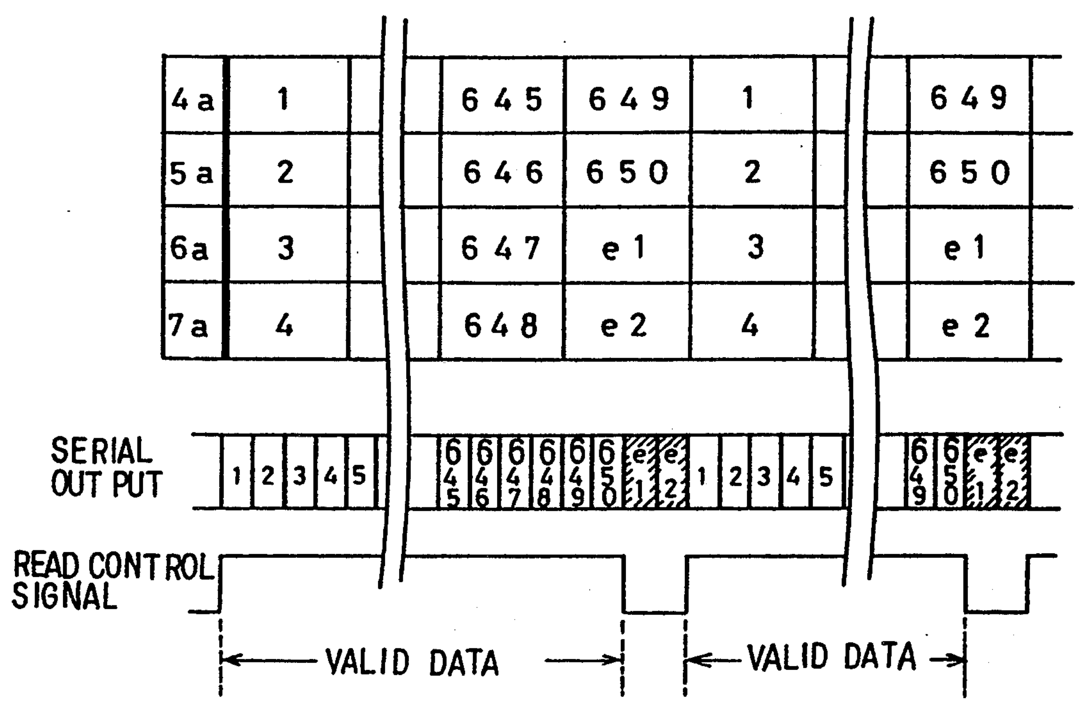
FIG. 5 is a timing chart of reading out the data according to the present invention.

The image data read out from the image memory is serial-converted by the parallel-to-serial converter 8, into the successive image data as dot 1, dot 2 . . . and then inputted into the processing unit 9 as shown in FIG. 5. Subsequently, only the valid dot portion of the image data in the thus serial-converted image data is read out by a read control signal outputted by the memory controller 3. For example, in the odd field memory, dots e1, e2 are invalidated and the dots other than e1, e2 are validated. The data processing unit 9 converts the serial-converted image data into an analog signal so as to input the data to the display device 10.

As described above, when the total number of dots on one line cannot be divided without remainder by the number of dots written in the image memory in parallel, the portion in which the odd field data and the even field data both exist, is written into both the odd field memory and the even field memory, by controlling (enabling) both the write enable signals for the odd field and the even field data outputted from the memory controller. Further, only the valid data is read out from both the even field memory and the odd field memory, and therefore, the writing/reading operation of the image memory can be controlled without error. Furthermore, since the computer is allowed to output a predetermined number of dots of the image data at a time irrespective of which line being output, it is not necessary for the computer to be provided with any special output specification for outputting data.

Incidentally, in the embodiment of the present invention, the apparatus is so constructed that the writing operation is performed prior to the reading operation. However, it is also possible to have a two bank construction in which exclusive odd and even field image memories are provided for each of writing and reading operations, so that the reading operation can be simultaneously performed while the image data is being written into the image field memory.

Figure 6:
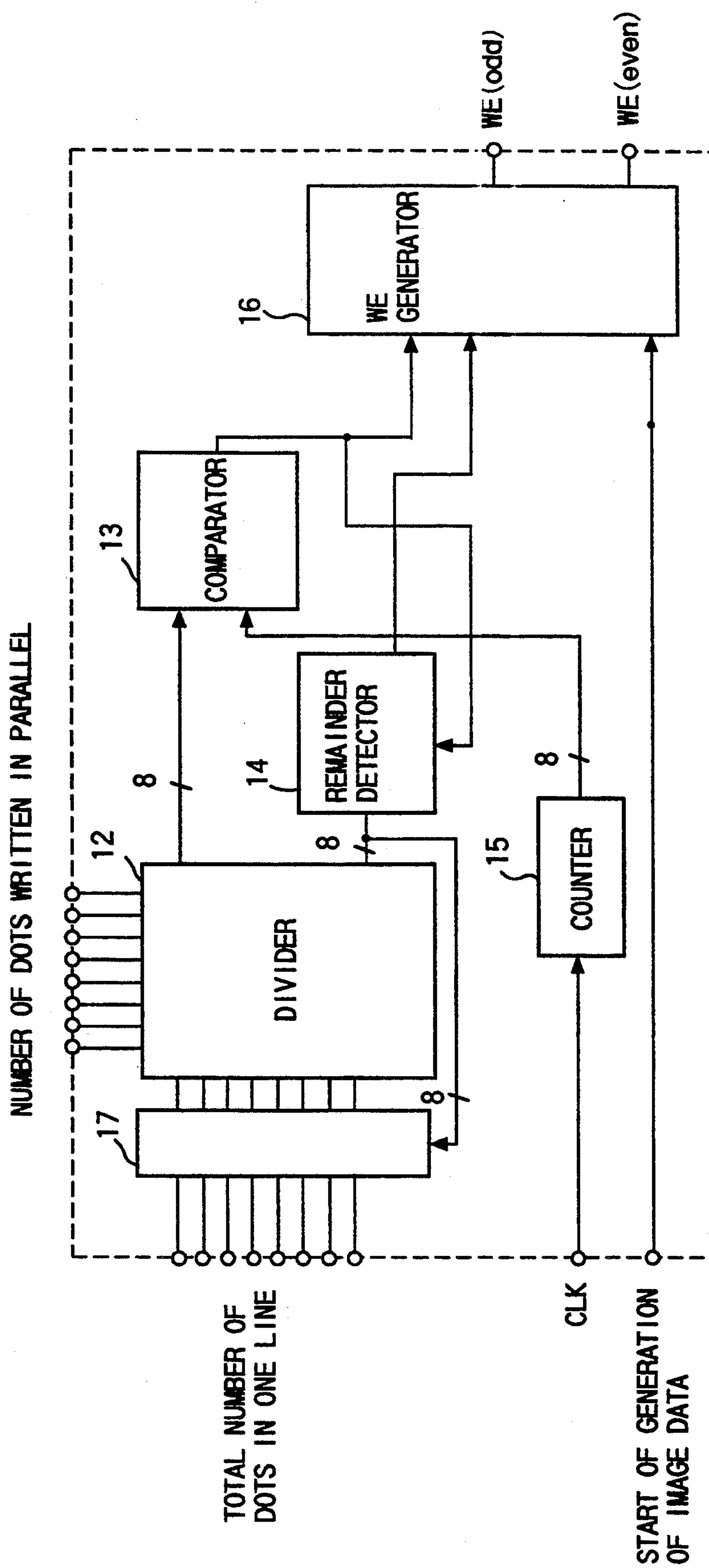
FIG. 6 is a block diagram showing a memory controller according to the embodiment of the present invention.

FIG. 6 shows an example of the structure of the memory controller of the image memory system usable as the memory controller 3 shown in FIG. 1. This memory controller is a general controller which can be used when the total number of the dots on one line and the number of the dots to be written into the image memory in parallel are optionally set. It is not necessary to employ such a structure if the total number of dots on one line and the number of dots written into the image memory in parallel is fixedly predetermined.

The general memory controller in FIG. 6 comprises a divider 12, a comparator 13, a remainder detector 14, a counter 15, a WE signal generator 16, and an adder 17. In this example, the total number of dots on one line and the number of dots simultaneously written into the image memory in parallel are defined by eight-bit data, respectively. The adder 17 outputs the sum of the total number of dots on one line inputted and the remainder output from the divider 12. The remainder of the divider 12 is at first null. The divider 12 outputs the quotient and the remainder which results from dividing the total number of dots on one line given through the adder 17 by the number of the dots to be written into the memory in parallel. On the other hand, the counter 15 counts the writing clock (CLK) which is generated each time the predetermined number of dots are written in parallel. The comparator 13 compares the quotient outputted by the divider 12 with the count value of the counter 15, and generates a pulse for one clock period when the count value reaches the quotient. The detector 14 is provided for detection that the remainder outputted by the divider 12 is not null. If the detector 14 detects that a remainder has occurred, the detector 14 generates the pulse for one clock period at the rising edge of the output pulse generated by the comparator 13. If the detector 14 detects that there is no remainder, it generates no pulse. The remainder value outputted by the divider 12 is added to the total number of dots on one line in the adder 17 so as to be redivided. Accordingly, the remaining number of dots out of the number corresponding to the quotient value by the divider 12, which resulted from dividing the total number of dots on one line by the number of dots to be -written in parallel into the memory, is added to the total number of dots on the subsequent line. The WE signal generator 16 generates WE(odd) and WE(even) in response to the outputs from both the comparator 13 and the remainder detector 14 as well as the signal indicating the start of generation of the image data.

The relationship between WE(odd), WE(even) and the parallel writing of the image data as seen in FIG. 3 will now be described. When the image data is written into the memories in units of the plurality of dots in parallel and there are dots for the odd field and for the even field therein, both of the control signals WE(odd) and WE(even) become a high level during only the period of writing the plurality of dots, as described with reference to FIGS. 3 and 4. Accordingly, the plurality of dots are simultaneously written into the odd and even field memories only during the period of writing the plurality of dots.

Figure 7:
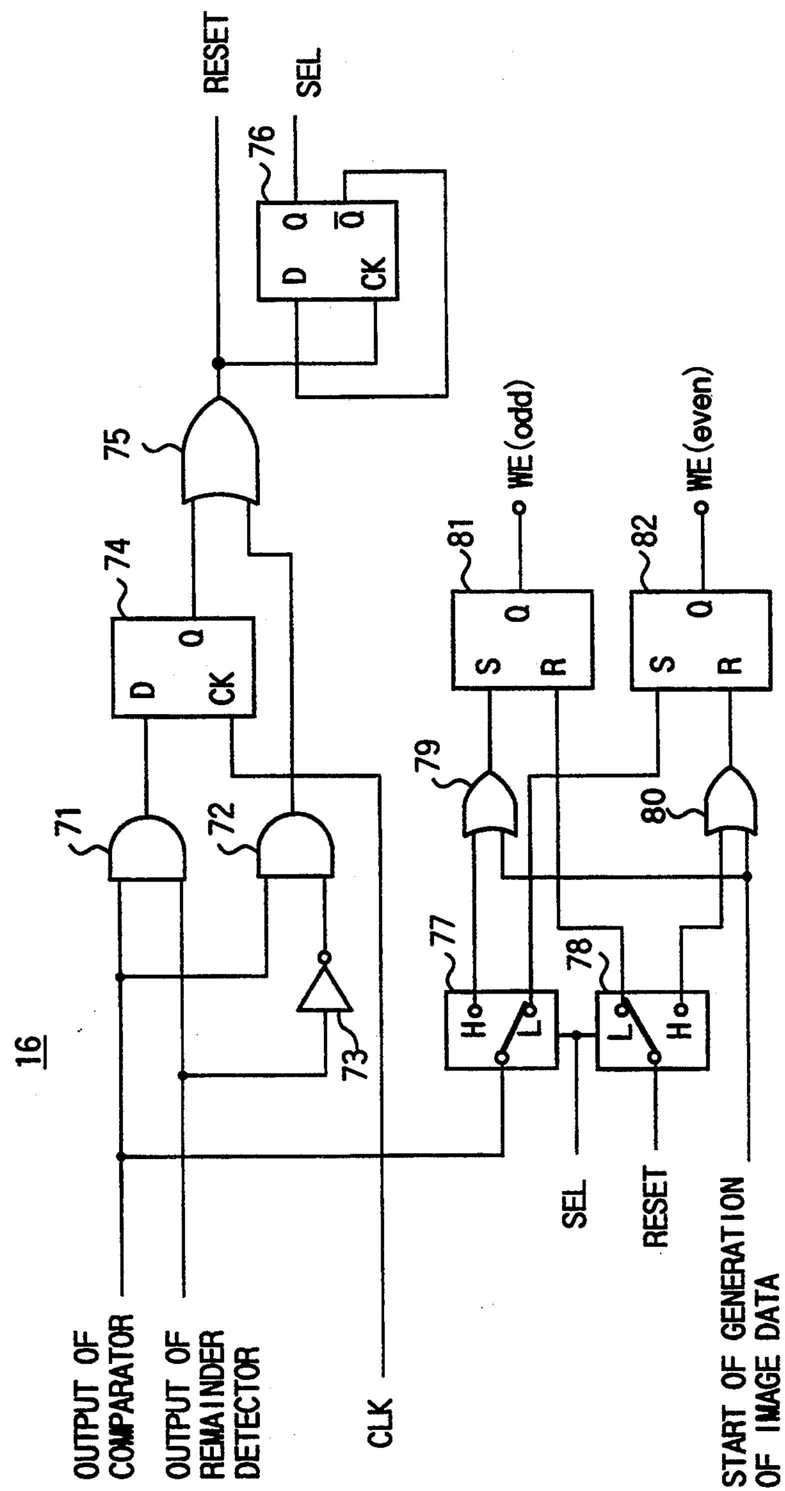
FIG. 7 is a circuit diagram showing a structure of the memory controlled in FIG. 6.

FIG. 7 shows an internal structure of the WE signal generator This circuit comprises AND gates 71, 72, an inverter 73, flip-flops 74, 76, 81, 82, OR gates 75, 79, 80, and selectors 77, 78.

Figures 8A, 8B:
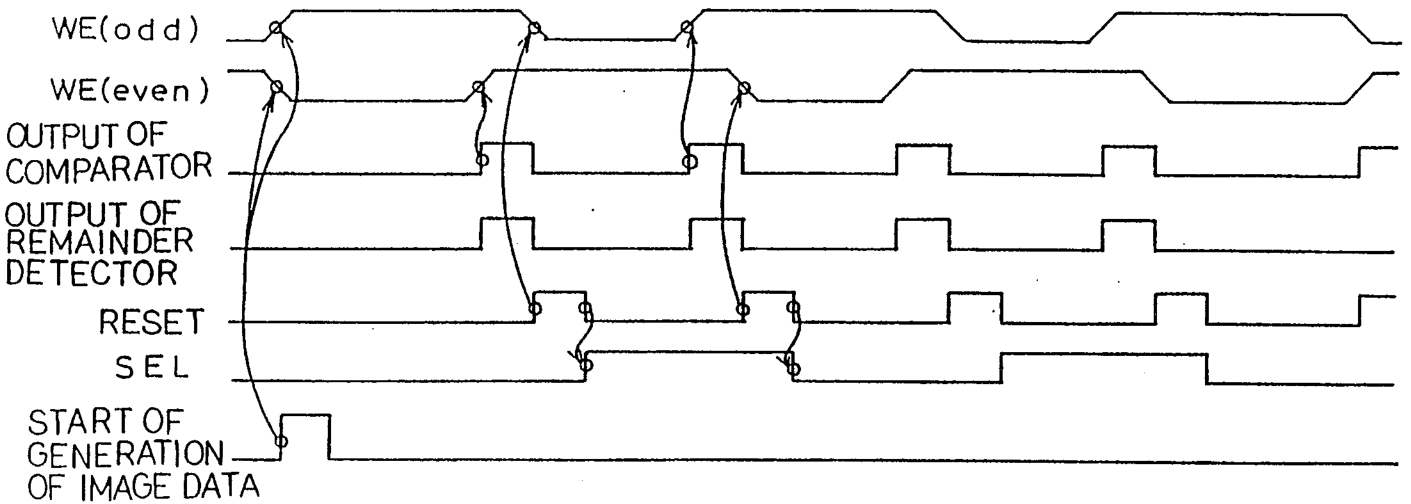
FIG. 8 is a timing chart for explaining another structure of the memory controller in FIG. 6.

The operation of generating the signal in the circuit of FIGS. 6 and 7 in relation to FIG. 8 will now be described. The signal indicating the start of generation of the image data outputted at the beginning of frame causes WE(odd) to rise and WE(even) to fall. When the value of the counter 15 reaches the value of the quotient of the divider 12, the pulse is generated by the comparator 13. At the rising edge of the pulse generated by the comparator 13, the WE(even) rises, and if there is a remainder, a pulse is simultaneously generated by the remainder detector 14. When there is an output from the remainder detector 14, the pulse with one clock delay from the pulse generated by the comparator 13 is outputted as a reset pulse from the flip-flop 74. The rising edge of this reset pulse causes the WE(odd) to fall. On the other hand, if there is no remainder, the reset pulse is outputted simultaneously with the output from the comparator 13. The rise of the reset pulse causes the WE(odd) to be at a low level. Namely, when there is no remainder, the control signals WE(odd) and WE(even) change simultaneously. The reset signal is ½ divided by the flip-flop 76 to be a SEL signal. When the SEL signal is at a high level, the WE(odd) rises with the output of the comparator 13, and WE(even) falls with the output of the reset signal. In FIG. 8, the example is shown in which the number of the dots on one line is set to 21 dots, and the number of dots to be written into the memory in parallel is set to 5 dots for concise explanation.

In FIG. 6, by making the circuity enclosed within the dashed line an integrated circuit, there can be provided a memory controller integrated circuit in which the signal for controlling the writing of the image data into the image memory can be outputted without error even if the total number of dots on one line is not divisible by the number of dots to be written in parallel into the image memory, provided that the total number of dots on one line and the number of the to be written into the image memory in parallel are given.

In the foregoing embodiment, the image memory system for converting the non-interlace image data which is outputted by the computer, into the interlace image data, is described. The image memory system of the present invention further includes an image processing apparatus with the use of personal computer or a large-sized computer, and scan converter of the display device such as a television and VTR.

According to the present invention, when the total number of dots on one line cannot be divided by the number of the dots to be written into the image memory in parallel, the writing/reading operation from the image data can be controlled without error at high speed, by controlling the control signals of writing the image data into the respective field memories. Further, there is an advantage that it is not necessary to change the output specification on the side of the output device which outputs the image data such as a computer.

What is claimed is:

1. A method of controlling an image memory system in which non-interlace image data is written into an odd field memory and an even field memory, and the contents of the odd field memory and the even field memory are separately read out so as to convert the non-interlace image data to interlace image data, the method comprising the steps of:

writing each line of the non-interlace image data alternately into the odd field memory and the even field memory a plurality of dots by dots;

writing image data of the plurality of dots simultaneously into both the odd field memory and the even field memory, when the plurality of dots include both dots for the odd field and dots for the even field;

invalidating the image data of the dots for the odd field memory written in the even field memory when the image data is read out from the even field memory; and invalidating the image data of the dots for the even field memory written in the odd field memory when the image data is read out from the odd field memory.

2. A method of controlling an image memory system in which image data is written into a first image memory and a second image memory, and read out the contents of the first image memory and the second image memory so as to convert the image data, the method comprising the steps of:

writing each line of the image data alternately into the first image memory and the second image memory a plurality of dots by dots;

writing the image data of the plurality of dots simultaneously into both the first image memory and the second image memory, when the plurality of dots include dots on one line and dots on the adjacent line;

invalidating the image data of the dots for the second image memory written in the first image memory when the image data is read out from the first image memory; and invalidating the image data of the dots for the first image memory written in the second image memory when the image data is read out from the second image memory.

3. An image memory system comprising:

a first field memory for writing image data on odd lines in parallel a plurality of dots by dots;

a second field memory for writing image data on even lines in parallel a plurality of dots by dots;

memory control means for controlling writing/reading of the image data with respect to the first and the second field memories; and parallel-to-serial conversion means for converting parallel image data read out from the first and the second field memories by the memory control means, into serial image data, said memory control means having means for writing, when the plurality of dots to be written includes dots for one field memory and dots for another field memory, the image data of the plurality of dots is simultaneously written into both the first and the second field memories.

4. An image memory system according to claims 3, further comprising data processing means for invalidating the image data for the second field written into the first field memory and for invalidating image data for the first field written into the second field memory, in the data outputted from the parallel-to-serial conversion means.

5. An image memory system according to claim 3, wherein said memory control means generates, upon receipt of the total number of dots on one line and the number of dots to be written in the image memories in parallel, one of two enable signals at a time for permitting writing of each line of the image data alternately into the first and the second field memories and, when the plurality of dots to be written include dots for one field and dots for another field, generates the two enable signals at the same time for permitting writing the plurality of dots both into the first field memory and the second field memory.

* * * * *